United States Patent [19]

Kajikawa et al.

[11] 4,152,666
[45] May 1, 1979

[54] FET AMPLIFIER COMPRISING A CIRCULATOR FOR AN INPUT SIGNAL AS AN ISOLATOR

[75] Inventors: Mitsugi Kajikawa; Sachiro Fukuda; Wakoto Akinaga, all of Tokyo, Japan

[73] Assignee: Nippon Electric Co., Ltd., Tokyo, Japan

[21] Appl. No.: 929,052

[22] Filed: Jul. 28, 1978

[51] Int. Cl.² ............................................. H03F 3/16
[52] U.S. Cl. .................................. 330/277; 330/286; 330/296; 330/302
[58] Field of Search ................. 330/56, 277, 286, 287, 330/296, 302

[56] References Cited

U.S. PATENT DOCUMENTS 4,011,518  3/1977  Irvine et al. ...................... 330/277 X Primary Examiner—James B. Mullins
Attorney, Agent, or Firm—Sughrue, Rothwell, Mion, Zinn and Macpeak

[57] ABSTRACT

In an FET amplifier comprising a series connection of a coaxial-to-waveguide converter and a circulator for supplying an FET with an input signal of a wide microwave band, such as an octave band between about 1 GHz and 12 GHz, a d.c. bias voltage is applied to the FET through the circulator from a terminator therefor. For this purpose, the terminator comprises an inner and an outer conductor insulated ohmically from each other and shunted for the microwave band, as by a capacitor of several picofarads. Preferably, a resistor and a third conductor are successively connected to the inner conductor with the capacitor placed at an end of the resistor remoter from the inner conductor and with a dummy for the input signal positioned between the outer and the third conductors.

3 Claims, 4 Drawing Figures

FIG. 3
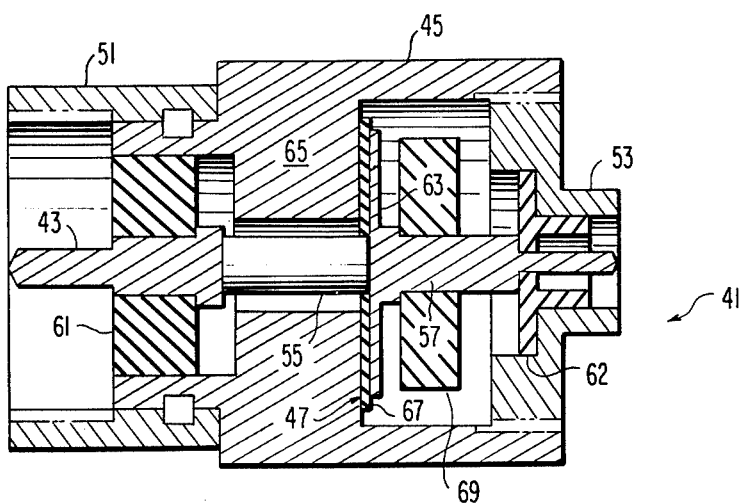
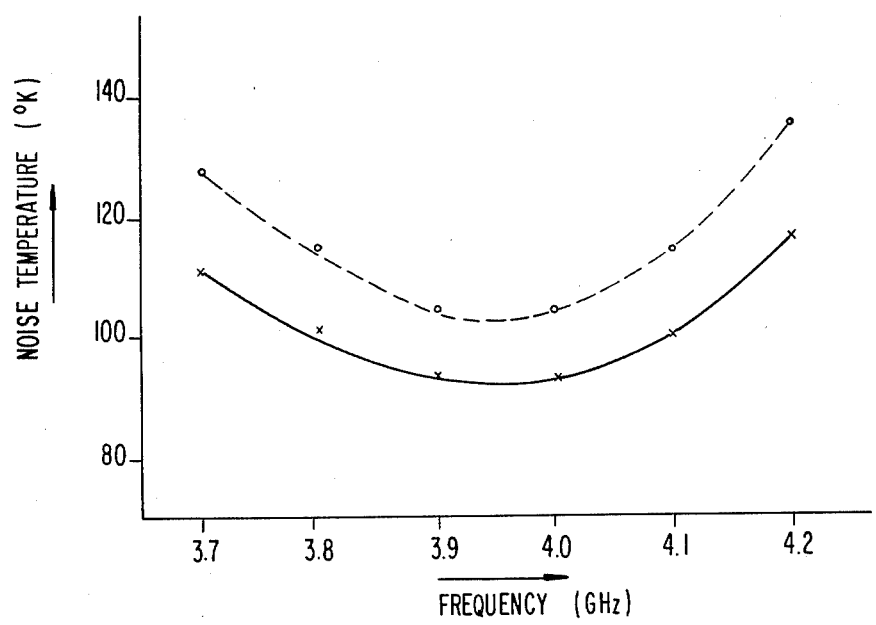
FIG. 4

FET AMPLIFIER COMPRISING A CIRCULATOR FOR AN INPUT SIGNAL AS AN ISOLATOR

BACKGROUND OF THE INVENTION

This invention relates to a microwave amplifier comprising a field-effect transistor (abbreviated to FET as usual) as an amplifying active element, namely, to an FET amplifier.

An FET amplifier is welcomed in view of its low-noise characteristics, high output power saturation level, and reasonable price. In a conventional FET amplifier, a blocking capacitor and a low-pass filter are indispensable to supply a d.c. bias voltage to the FET. This has rendered the FET amplifier still defective because of a high noise temperature and a relatively narrow operable bandwidth as will later be described with reference to one of several figures of the accompanying drawing.

SUMMARY OF THE INVENTION

It is therefore an object of the present invention to provide an FET amplifier of excellent noise-temperature characteristics.

It is another object of this invention to provide an FET amplifier of the type described, which has a wide operable bandwidth.

It is still another object of this invention to provide an FET amplifier of the type described, wherein neither a blocking capacitor nor a low-pass filter is necessary to supply a d.c. bias voltage to an FET that serves as an amplifying active element of the FET amplifier.

According to this invention, there is provided a microwave amplifier comprising a field-effect transistor as an amplifying active element, a bias voltage circuit for producing a d.c. bias voltage for the transistor, a coaxial-to-waveguide converter for an input signal of a microwave band, and a circulator having a first port for receiving the input signal through the converter, a second port for supplying the input signal to the transistor, and a third port terminated by a terminator that comprises, in turn, a first conductor for receiving the bias voltage from the bias voltage circuit, a second conductor, and coupling means for shunting the first and the second conductors in the microwave band to have the bias voltage supplied to the transistor through the second port.

In short, the circulator is used in an FET amplifier according to this invention as an isolator.

BRIEF DESCRIPTION OF THE DRAWING

FIG. 3 is a schematic axial sectional view of a terminator for use in an FET amplifier according to a more preferred embodiment of this invention; and FIG. 4 shows noise-temperature characteristics of a conventional FET amplifier and an FET amplifier according to an embodiment of this invention.

DESCRIPTION OF THE PREFERRED EMBODIMENTS

Figure 1:
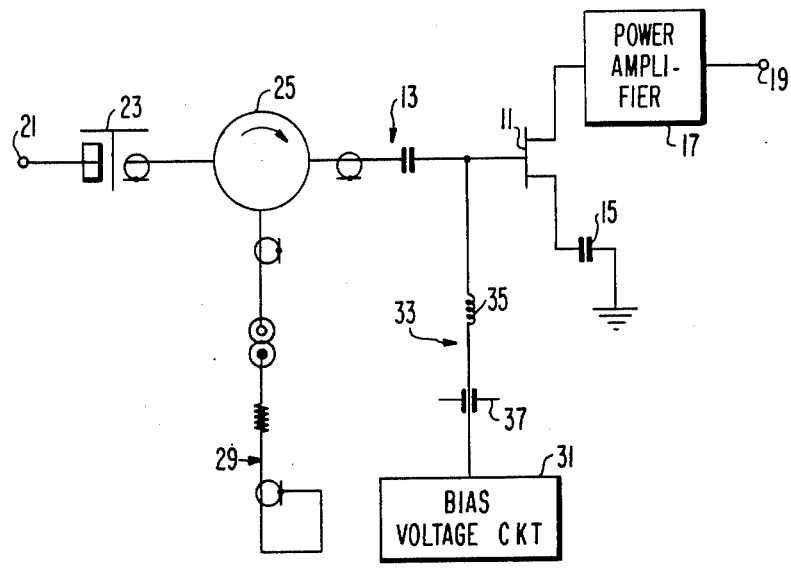
FIG. 1 shows the circuit of a conventional FET amplifier.

Referring at first to FIG. 1, a conventional FET amplifier will be described for a better understanding of the present invention. The amplifier comprises an FET 11 having a gate electrode supplied with an input signal of a microwave band and a d.c. bias voltage for the transistor 11, both through an input circuit 13, a source electrode grounded by a grounding capacitor 15 for the microwave band, and a drain electrode connected to a power amplifier 17, which supplies a power-amplified output signal to an output terminal 19. The microwave band, as called herein, is preselected usually between about 1 GHz and 12 GHz or higher. The transistor 11 serves as an amplifying active element of the FET amplifier and is preferably a gallium arsenide Schottky-barrier FET. The input circuit 13 comprises an input terminal 21 of a coaxial line for the input signal, a coaxial-to-waveguide converter 23 supplied with the input signal from the input terminal 21, and a three-port circulator 25 having a first port for receiving the input signal through the converter 23, a second port for supplying the input signal to the transistor gate electrode through a blocking capacitor 27 described later, and a third port terminated by a terminator 29. The bias voltage is produced by a bias voltage circuit 31 and supplied to the transistor gate electrode through a bias supplying circuit 33 that forms a part of the input circuit 13 and is accompanied by a low-pass filter comprising an inductor 35 and a bypass capacitor 37. The cutoff frequency of the low-pass filter is usually set at about 1 MHz. The signal actually supplied to the transistor gate electrode may be somewhat different from that supplied to the input terminal 21. Such signals, however, are referred to merely as the input signal according to the usual practice. The bias voltage applied to the transistor gate electrode is substantially identical with that produced by the bias voltage circuit 31.

In FIG. 1, a ceramic capacitor of a chip type is generally used as the blocking capacitor 27. The inductor 35 is an air-core coil. The bypass capacitor 37 is a ceramic capacitor of a through type. At any rate, the blocking capacitor 27 serves well to prevent the d.c. bias voltage from being grounded through the circulator 25 and the terminator 29 but does not work well to short the second port of the circulator 25 to the gate electrode of the transistor 11 even in the microwave band, inevitably giving the input signal a loss of about 1 dB. The blocking capacitor 27 therefore undesiredly serves as a factor for deteriorating noise-temperature characteristics of the FET amplifier. On the other hand, the noise temperature of the transistor 11 depends on a signal source impedance seen from the transistor 11 towards the input side and is rendered minimum when the source impedance is given an optimum value. It is therefore necessary, in order to make the FET amplifier serve as a low-noise amplifier in a wide band, such as an octave band, to keep the source impedance optimum throughout the wide band. Use of the coaxial line in the input circuit 13 is advantageous in this respect. Use of the inductor 35 and the bypass capacitor 37, however, is objectionable because they give rise to a considerable phase variation of the source impedance. Besides thus deteriorating the wide-band characteristics, the inductor 35 and the bypass capacitor 37 give a loss to the input signal to unavoidably serve as other factors for deteriorating the noise-temperature characteristics.

Figure 2:
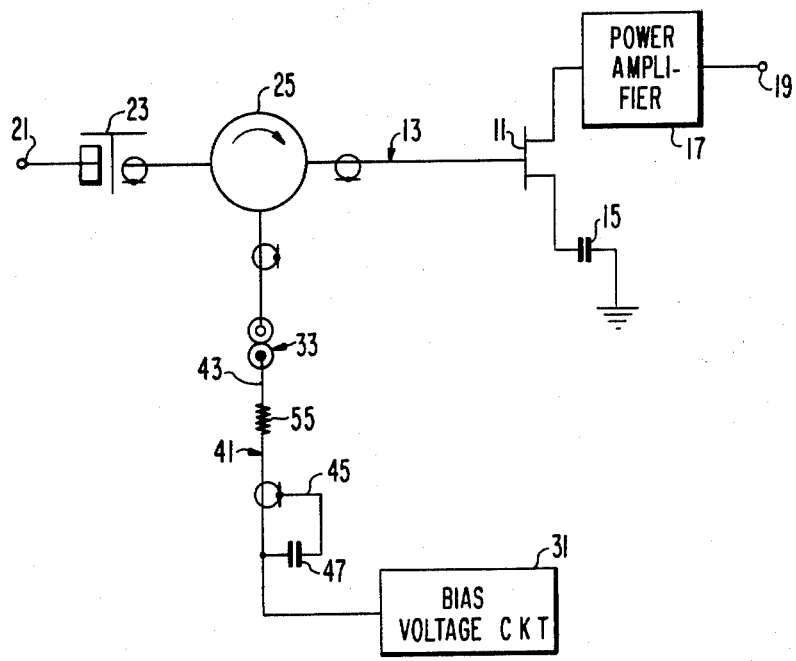
FIG. 2 shows, partly in blocks, the circuit of an FET amplifier according to an embodiment of the instant invention.

Referring now to FIG. 2, an improved FET amplifier according to an embodiment of the present invention comprises similar parts designated by like reference numerals as in FIG. 1. The improved amplifier, however, does not comprise the blocking capacitor 27, the inductor 35, and the bypass capacitor 37 that adversely affect the noise-temperature characteristics and the wide operable bandwidth as described hereinabove. Instead, the d.c. bias voltage is supplied to the gate electrode of the transistor 11 through the bias supplying circuit 33 that now comprises the circulator 25. More particularly, use is made of a circulator 25 having a central conductor and of a terminator 41 that comprises a first or inner conductor 43 for receiving the bias voltage, a second or outer conductor 45, and a shunt capacitor 47 for shunting the first and the second conductors 43 and 45 in the microwave band and insulating the conductors 43 and 45 from each other for the bias voltage. The bias voltage is never grounded because the first port of the circulator 25 is supplied with the input signal from that antenna of the converter 23 which is ohmically insulated from the outer conductor 45.

Turning to FIG. 3, a terminator 41 for use in an FET amplifier according to a more preferred embodiment of this invention comprises an inner conductor 43 coupled to an outer conductor 45 through a shunt capacitor 47. The outer conductor 45 has an SMA or r.f. connector 51 at one end for direct connection to the circulator 25 (FIG. 2) and a UM or d.c. connector 53 at the other and for connection to the bias voltage circuit 31. The inner conductor 43 is connected to a first end of a solid resistor 55 having a prescribed resistance, such as 50 ohms, and a second end connected, in turn, to a third conductor 57 that serves as a central conductor of the UM connector 53. The inner conductor 41, the solid resistor 55, and the third conductor 57 are supported in the outer conductor 45 in axial alignment by means of first and second insulator members 61 and 62. The shunt capacitor 57 comprises a conductor disk 63 radially outwardly extended from the second end of the solid resistor 55, an annular ridge 65 radially inwardly protruded from the outer conductor 45 towards the solid resistor 55, and an insulator disk 67 interposed between the conductor disk 63 and the annular ridge 65 to provide a capacity of several picofarads. A dummy 69 of an electromagnetic-wave absorbing material is interposed between the outer and the third conductors 45 and 57 to prevent the input signal from leaking from the SMA connector 51 to the UM connector 53. The dummy 69 is attached to the third conductor 57 in the example being illustrated.

Finally referring to FIG. 4, the noise temperature of a conventional FET amplifier is depicted by a broken line curve. In contrast, the noise temperature exemplified by a solid line for an FET amplifier according to an embodiment of this invention shows an improvement of about 15° K. in a microwave band between about 3.7 GHz and 4.2 GHz. The improvement corresponds to a reduction of the noise by about 0.3 to 0.4 dB.

What is claimed is:

1. A microwave amplifier comprising a field-effect transistor as an amplifying active element, a bias voltage circuit for producing a d.c. bias voltage for said transistor, a coaxial-to-waveguide converter for an input signal of a microwave band, and a circulator having a first port for receiving said input signal through said converter, a second port for supplying said input signal to said transistor, and a third port terminated by a terminator that comprises, in turn, a first conductor for receiving said bias voltage from said bias voltage circuit, a second conductor, and coupling means for shunting said first and said second conductors in said microwave band to have said bias voltage supplied to said transistor through said second port.

2. A microwave amplifier as claimed in claim 1, wherein said first conductor is accompanied by a resistor having one end connected to said first conductor and a third conductor between the other end of said resistor and said bias voltage circuit, said first conductor, said resistor, and said third conductor being colinear, said second conductor having an inside surface coaxially of said first conductor, said coupling means comprising a conductor disk radially outwardly extended from said other end of said resistor, an annular ridge radially inwardly protruded from said inside surface towards said resistor, and an insulator disk interposed between said conductor disk and said annular ridge.

3. A microwave amplifier as claimed in claim 2, wherein said coupling means further comprises a dummy between said inside surface and said third conductor for absorbing said input signal.

* * * * *

UNITED STATES PATENT AND TRADEMARK OFFICE
CERTIFICATE OF CORRECTION

PATENT NO. : 4,152,666
DATED : May 1, 1979
INVENTOR(S) : Mitsugi KAJIKAWA et al

It is certified that error appears in the above-identified patent and that said Letters Patent are hereby corrected as shown below:

IN THE HEADING:

Foreign Application Priority Data:

Insert -- Aug. 1, 1977   Japan......... 52-91358 --.

Signed and Sealed this

Eighteenth Day of December 1979

[SEAL]

Attest:

SIDNEY A. DIAMOND

Attesting Officer          Commissioner of Patents and Trademarks